United States Patent [19]
Hori et al.

[11] Patent Number: 5,259,923
[45] Date of Patent: Nov. 9, 1993

[54] DRY ETCHING METHOD

[75] Inventors: Masaru Hori, Aichi; Keiji Horioka, Kawasaki; Haruo Okano, Tokyo; Masao Ito, Yokohama; Masahito Hiratsuka, Kofu; Yoshio Ishikawa, Tokyo, all of Japan

[73] Assignee: Tokyo Electron Limited, Tokyo, Japan

[21] Appl. No.: 889,627

[22] Filed: May 28, 1992

[30] Foreign Application Priority Data

May 29, 1991 [JP] Japan ................... 3-124297

[51] Int. Cl.$^5$ .................... H01L 21/306; B44C 1/22; C23F 1/00; C03C 15/00
[52] U.S. Cl. .................... 156/643; 156/626; 156/652; 156/656; 156/657; 156/659.1; 156/662; 156/345; 252/79.1
[58] Field of Search ............... 156/626, 644, 650, 652, 156/656, 657, 659.1, 662, 345; 204/192.32, 192.33, 192.35, 192.37; 252/79.1

[56] References Cited

U.S. PATENT DOCUMENTS

| | | | |
|---|---|---|---|
| 4,713,141 | 12/1987 | Tsang | 156/643 |
| 5,094,712 | 3/1992 | Becker et al. | 156/643 |
| 5,110,408 | 5/1992 | Fujii et al. | 156/656 X |
| 5,169,487 | 12/1992 | Langley et al. | 156/643 |
| 5,180,464 | 1/1993 | Tatsumi et al. | 156/626 |

OTHER PUBLICATIONS

Plasma Chemistry and Plasma Processing, vol. 5, No. 3, Sep., 1985, A. Picard, et al., "Plasma Etching of Refractory Metals (W,Mo,Ta) and Silicon in SF$_6$ and SF$_6$–O$_2$ an Analysis of the Reaction Products".

Primary Examiner—William A. Powell
Attorney, Agent, or Firm—Oblon, Spivak, McClelland, Maier & Neustadt

[57] ABSTRACT

A dry etching method, wherein a multilayer film including one selected from tungsten, molybdenum, and a silicide thereof, as the first layer, and polycrystal silicon as the second layer underlying is formed on a silicon oxide insulation film, a substrate having a mask pattern on the multilayer film is placed in a vacuum container, an etching gas is introduced into the vacuum container, and an electrical discharge is induced by applying an electrical field to the vacuum container, thereby anisotropically etching the multilayered film in accordance with the mask pattern. The method comprises the first etching step for etching the first layer by use of the first gas selected from fluorine, sulfur hexafluoride, and nitrogen trifluoride, or a mixture gas containing the first gas and the second gas selected from hydrogen chloride, hydrogen bromide, chlorine, bromine, and carbon tetrachloride, as an etching gas, and the second etching step for etching the second layer by use of the second gas, or a mixture gas containing the second gas and the third gas selected from an inert gas, nitrogen gas, oxygen gas, silicon tetrachloride gas and carbon monoxide gas, as an etching gas.

12 Claims, 14 Drawing Sheets

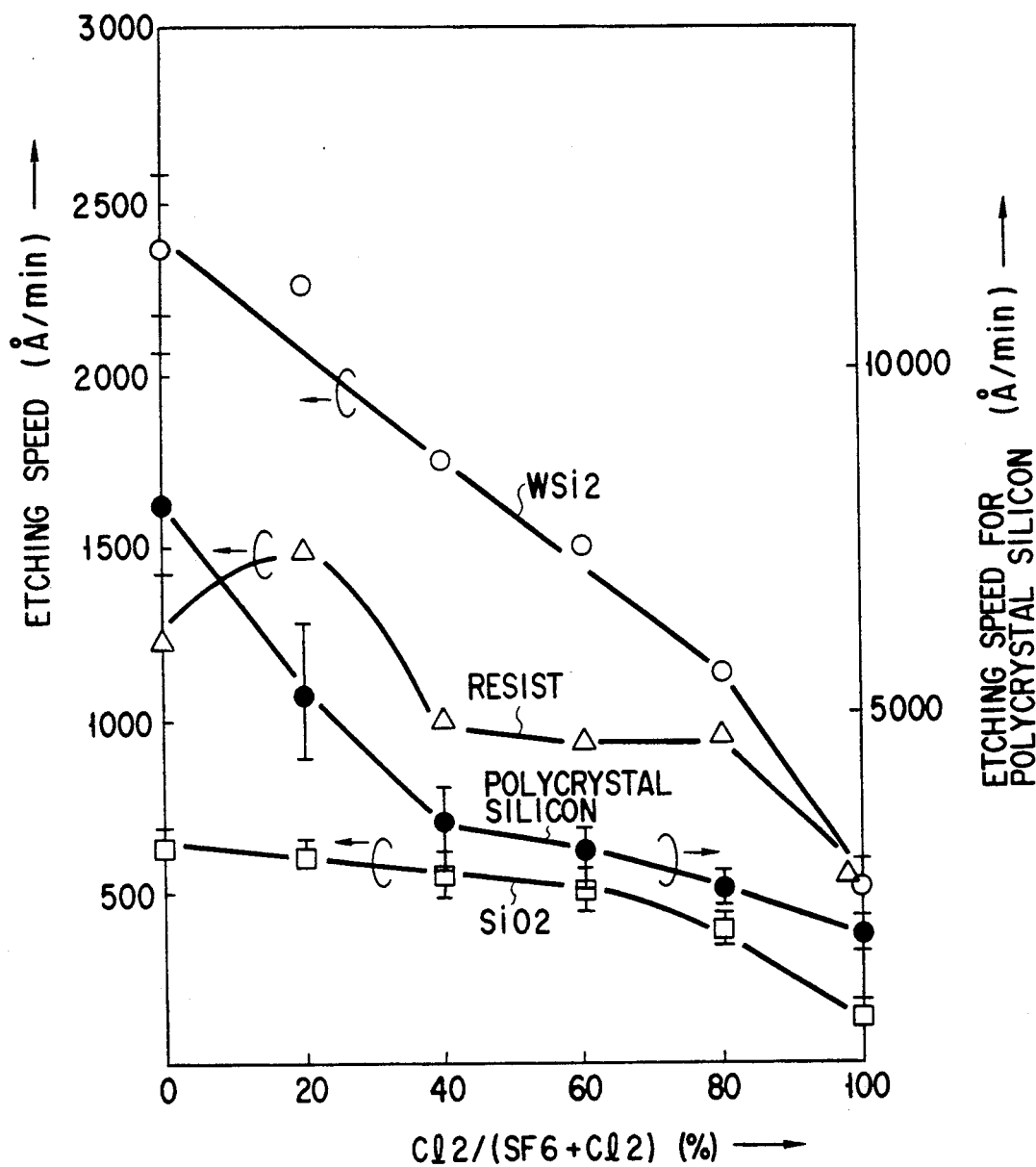
F I G. 3

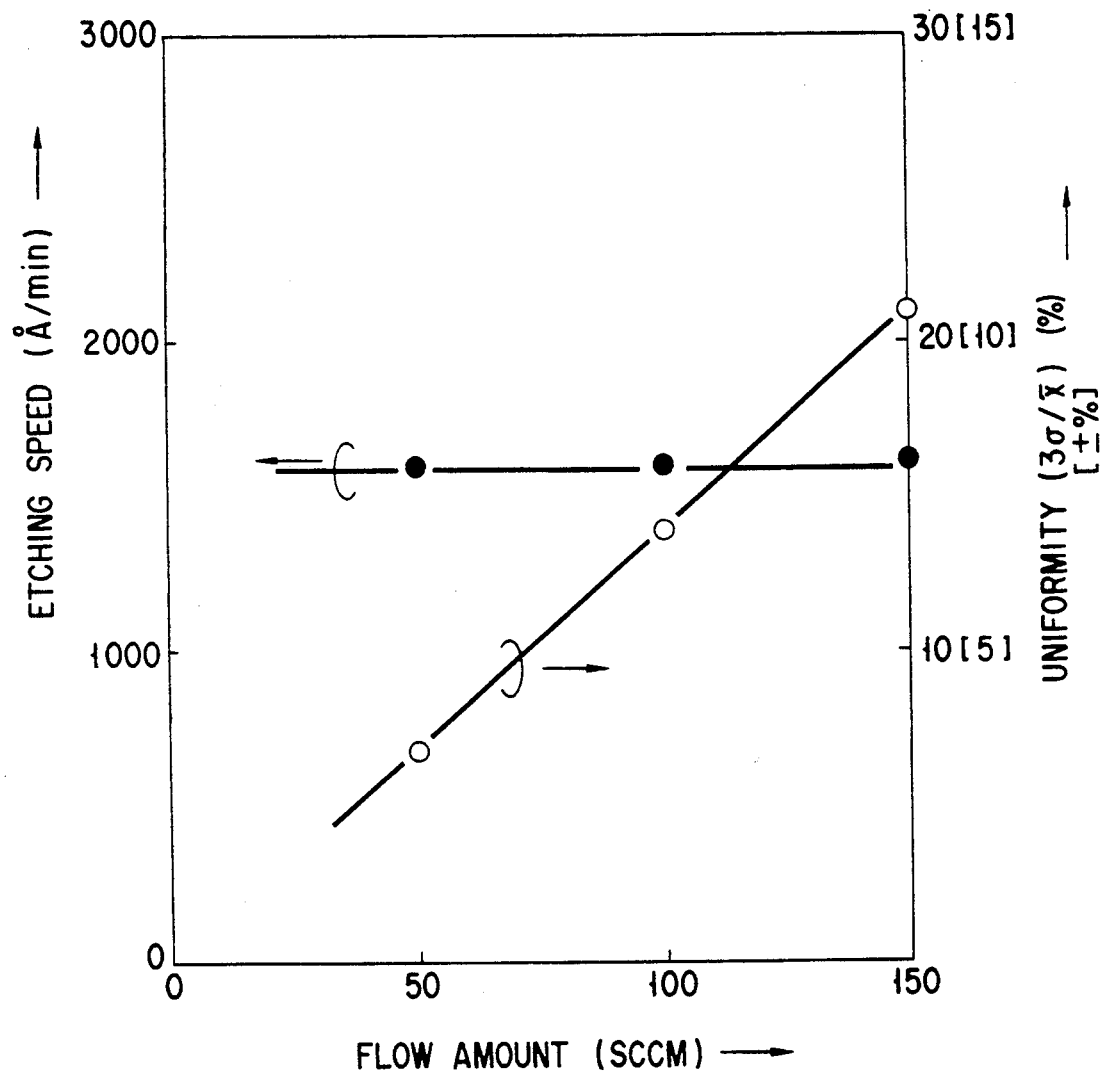
F I G. 9

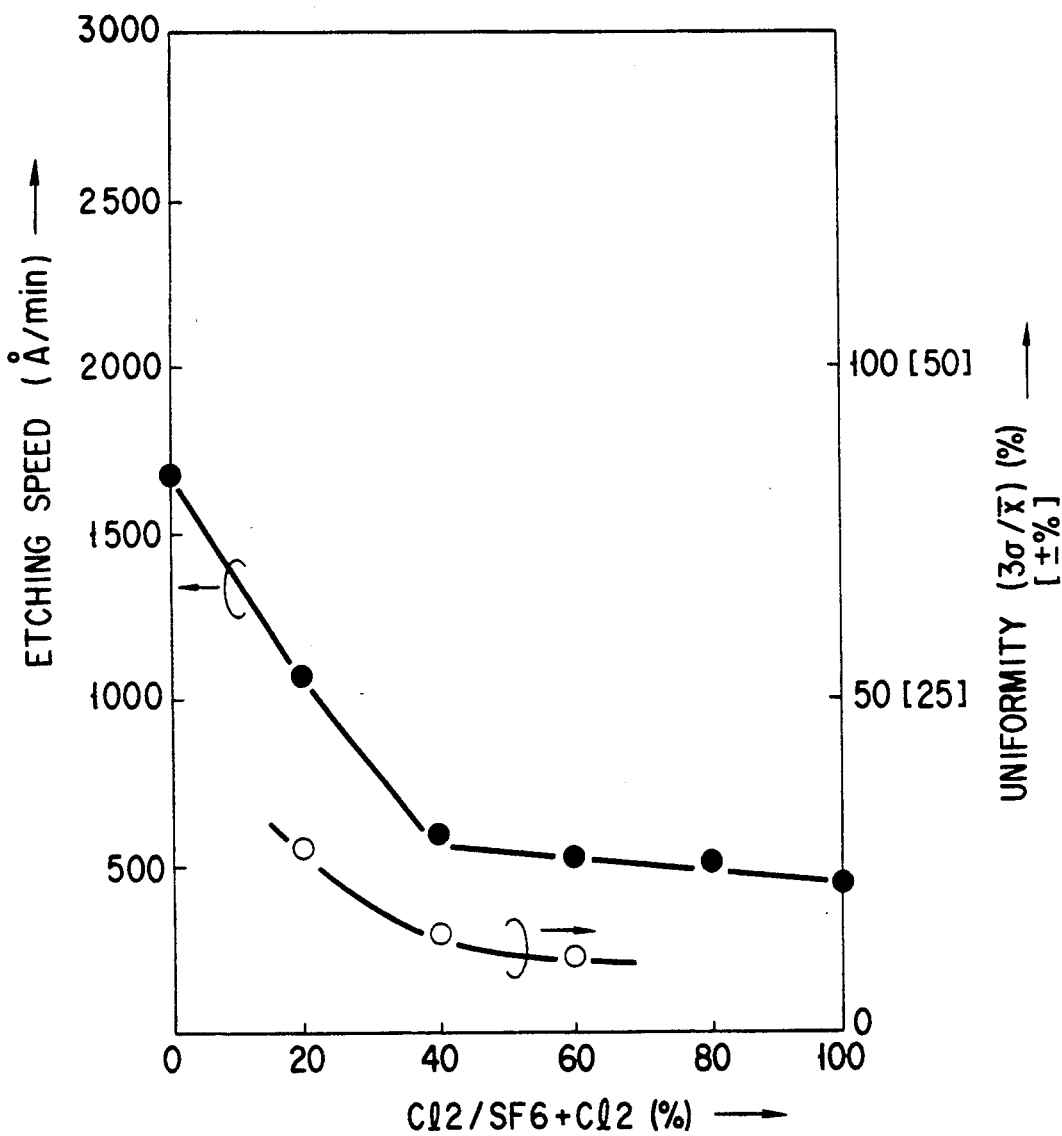
F I G. 10

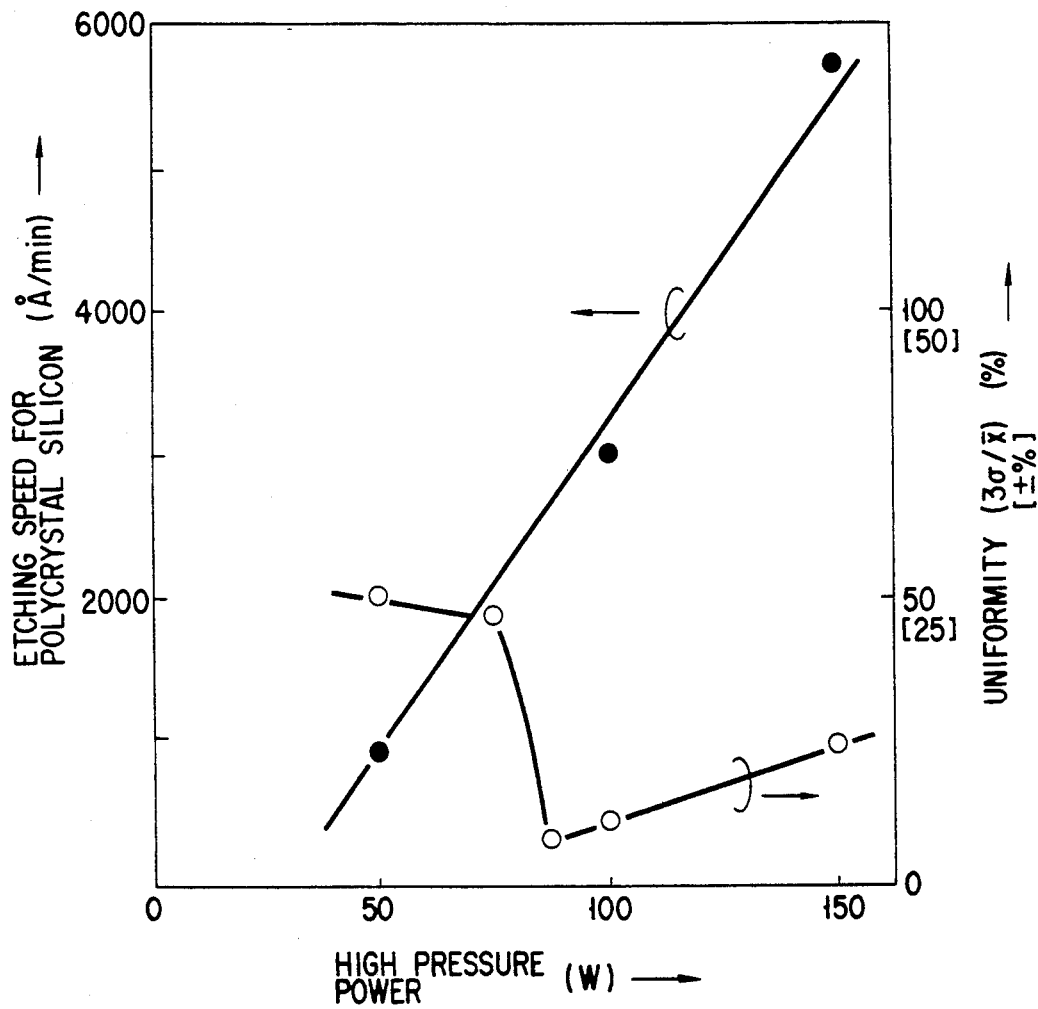
F I G. 11

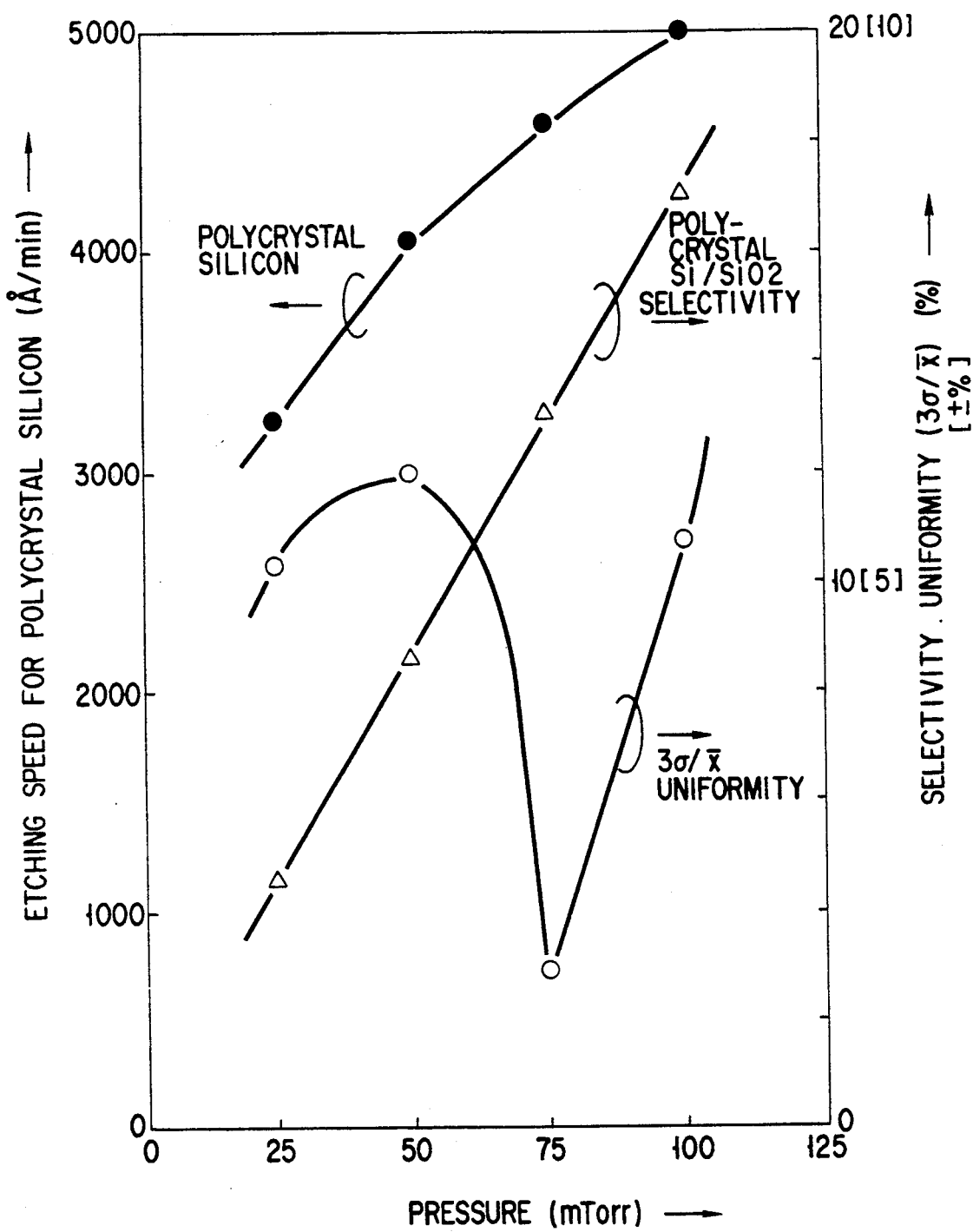
F I G. 13

DRY ETCHING METHOD

BACKGROUND OF THE INVENTION

1. Field of the Invention

The present invention relates to a dry etching method for etching a film having a multilayered structure including an insulation film such as silicon oxide film, and a film of tungsten, molybdenum, or a silicate of each, formed on the insulation film, or a structure including a film of one of those high melting point metal and a polycrystal silicon film.

2. Description of the Related Art

In accordance with higher integration density of semiconductor devices, size of circuits is rapidly reduced. However, such reduction in size creates a number of problems, particularly in the case where its gate electrode or wire is made of:

(1) a metal having low resistivity and melting point, such as aluminum (Al);

(2) a semiconductor material such as polycrystal silicon; or (3) a metal having a high melting point, such as tungsten (W) or molybdenum (Mo).

Regarding case (1) where Al is used as the gate electrode, since the melting point of Al is close 660° C., a heating process cannot be applied after deposition of Al during the course of forming an element. As a result, by use of Al, it is difficult to achieve a multilayered structure, and the integration density of such a structure cannot be increased. Further, after formation of the Al electrode, a diffusion process, which requires a high temperature of about 1000° C., cannot be performed. Therefore, the gate electrode must be formed after diffusion of the source drain region during the course of manufacturing MOSFETs. However, a certain amount of mask matching allowance has to be set between the gate electrode and the source-drain region, thereby decreasing the integration density of the structure. Further, the combined capacitance of the gate and the source, or the drain, is increased.

Regarding case (2) where polycrystal silicon is used as the gate electrode, the gate, source, and drain regions can be formed in the form of mask such that they self-matches with each other, and polycrystal silicon is relatively stable in a heating process; therefore wiring can be carried out in a multilayered manner, thereby achieving a high integration density. However, a polycrystal silicon film has a resistivity (specific resistance), and therefore it is necessary to add appropriate impurities to the film to decrease its resistance.

In reality, even if the impurities are added, the resistivity can be decreased only to $1 \times 10^{19}$ $\Omega$ cm, which is still very high as compared to $1 \times 10^{-6}$ II $\Omega$ cm of W or $1 \times 10^{-5}$ I $\Omega$ cm of Mo. Consequently, when circuit elements on a semiconductor are connected with each other by means of the polycrystal silicon film, transmission of a signal becomes so slow that the operation speed is limited. Similarly, when polycrystal silicon is used as a gate electrode of a MOSFET, the resistance-capacitance product becomes large due to its large resistance. Consequently, it takes long time to raise the voltage of the gate up to a set operation voltage, thereby reducing the operation speed.

Regarding case (3) where a high melting point metal such as W is used as a gate, despite of its high resistivity, W is relatively stable in a heating process of 1000° C., which is required during the course of forming semiconductor devices, because W has a very high melting point. However, as in the case of metals in general, W cannot withstand a process in a high-temperature and oxidating atmosphere.

As described, a satisfactory gate electrode cannot be formed in either of the above described cases. Some of the criteria for a good gate electrode are: the gate electrode is made of a crystal material having a small grain size., the surface of the electrode can be easily stabilized; the chemical resistance thereof is high; the contactibility thereof against Al or an Si substrate is high; and the anti-electromigration property is high.

In the meantime, use of a gate material having a multilayered structure of a metal silicide film such as tungsten silicide ($WSi_2$) and a polycrystal silicon film has been proposed for manufacturing a semiconductor device having the above-mentioned characteristics, namely a high integration density of polycrystal silicon gate electrode MOSFET, high stability and reliability of the MOSFET in a heating process during the course of manufacture, a low resistivity of the semiconductor device as compared to polycrystal silicon, and a high-speed operability of the device. Moreover, a multilayered structure of a high melting point metal such as tungsten and a polycrystal silicon film has been also proposed.

However, methods which deal with such multilayers have the following problems. In accordance with reduction in size of circuits, gate electrodes are minimized. Accordingly, gate insulation films formed underneath the gate electrodes have been thinned to about 10 nm. Therefore, the processability of a gate electrode depends not on its high melting point metal silicide film crystal, but on its polycrystal silicon film. If a desired shape is not obtained, i.e., the end of a silicon film cannot be withdrawn from the level of the end of a silicide film, deviation of the channel length occurs. Further, as the etching selection ratio between an oxidation silicon film serving as the gate insulation film and a polycrystal silicon film serving as the gate electrode is a main factor for determining the yield of products, an etching process must be carried out based on a high selection ratio between the oxidation silicon film and the gate insulation film. Thus, the process for forming a gate electrode entails a difficult problem.

There have been many reports on etching of a high melting point metal such as tungsten. Some of the examples are D. W. Hess (Tungsten Etching and $CF_4$ and $SF_6$ Discharges: Journal of the Electrochemical Society: January 1984, pages 115-120), Picard et al. (Plasma Etching of Refractory Metals (N. Mo. Ta) and Silicon in $SF_6$ and $SF_6$-$O_2$: Plasma Chemistry and Pasma Processing Vol. 5, No. 4 1985, pages 335-351), and E. Degenkolb et al. (Selective Dry Etching of W for VLSI Metalization: Journal of the Electro-chemical Society 167, Society Meeting Vol. 85-1, 1985, page 353). In each report, an etching gas containing fluorine ($SF_6$, $CF_4$, $CF_3$ Br or the like) are used. However, with a multilayered structure of a tungsten silicide and a polycrystal silicon, or a heat-oxidation film, a variety of problems, which do not occur with a tungsten single layer, rise during the processing step.

Meanwhile, Chi-Hwa et al. (Anisotropic Plasma Etching of Tungsten: U.S. Pat. No. 4,713,141, Dec. 15, 1987) a method of directionally etching a multilayer of a high melting point metal (for example, W) and a silicon or an insulation film. In this report, tungsten is etched by use of a mixture gas of $SF_6$ and $Cl_2$, which serves as an etching gas. According to the method disclosed, Cl, which can suppress reaction between tungsten and $SF_6$, is adhered on the side surface of an etching pattern, thereby realizing a directional etching.

However, in a practical sense, good etching cannot be performed by use of a fluorine containing gas such as sulfur hexafluoride ($SF_6$) or a mixture gas of a fluorine-containing gas and a carbon tetrachloride ($CCl_4$) or $Cl_2$, which is a conventionally used etching gas for a metal silicide film, because the selection ratio of these gas against silicon oxide is not sufficient as 10 or less.

Further, conventionally, a reactive ion etching technique is employed to etch a polycrystal silicon film. However, in the case where an anode coupling?? mode is employed for patterning, the selection ratio becomes large, but the processed shape will be undesirable, whereas in the case where a cathode coupling mode is used, the selection ratio becomes small, but the desirable shape can be obtained.

Moreover, it is also important that the etching proceeds at the same speed anywhere in a wafer surface. For example, if the etching proceeds faster in the periphery portion of the wafer than in the center portion, a problem occurs, that is, when etching is carried out until the center portion of the polycrystal silicon is completely removed, some of the underlying silicon oxide film in the periphery portion has been already etched.

In the case where the selection ratio against the silicon oxide is low, etching of the periphery portion of the silicon oxide proceeds until the gate insulation film is damaged. Further, since the etching resultants of the periphery and center portions differ from each other, the characteristics of plasma itself are changed. Consequently, an appropriate shape cannot be obtained.

As described, in the conventional process of a multilayer film formed on a silicon oxidation film, consisting of a high melting point metal or a silicide of the metal and a polycrystal silicon, it is difficult to realize an etching sufficient in terms of processed shape, selection ratio, and uniformity.

SUMMARY OF THE INVENTION

The present invention has been proposed in consideration of the above-described circumstance, and the purpose thereof is to provide a dry etching method for achieving an excellent processed shape and sufficient selectivity, in process of a multilayer film formed on a silicon oxidation film or the like, consisting of a high melting point metal or a silicide of the metal and a polycrystal silicon.

The main feature of the invention is to select the most suitable type of gas in the dry etching process, and set the best possible etching condition for processing the above-mentioned multilayer film.

According to the present invention, there is provided a dry etching method, wherein a multilayer film including on selected from the group consisting of tungsten, molybdenum, a tungsten silicide, and a molybdenum silicide, as the first layer, and polycrystal silicon as the second layer underlying is formed on a silicon oxide insulation film, a processed substrate prepared by forming a mask pattern on the multilayer film is placed in a vacuum container, an etching gas is introduced into the vacuum container, and an electrical discharge is induced by applying an electrical field to the vacuum container, thereby anisotropically etching the multilayered film in accordance with the mask pattern, comprising:

the first etching step for etching the first layer by use of the first gas which is selected from the group consisting of fluorine, sulfur hexafluoride, and nitrogen trifluoride, or a mixture gas consisting of the first gas and the second gas which is one selected from the group consisting of hydrogen chloride, hydrogen bromide, chlorine, bromine, and carbon tetrachloride, as an etching gas; and the second etching step for etching the second layer by use of the second gas, or a mixture gas of the second gas and the third gas which is selected from the group consisting of an inert gas, nitrogen gas, oxygen gas, silicon tetrachloride gas and carbon monoxide gas, as an etching gas.

In the first etching step, etching of the first step should preferably be carried out under the conditions that a mixture gas containing sulfur hexafluoride and chloride is used as an etching gas, the mixture ratio of sulfur hexafluoride and chlorine is set between 4:6 and 7:3, the gas flow amount is set between 20 and 150 sccm, and the high frequency power density is set between 0.4 and $0.9 W/cm^2$.

In the second etching step, the amount of the third gas added to the second gas should preferably be in the range between 0 and 10 volume % of the whole etching gas, the third gas being one selected from the group consisting of inert gas, nitrogen gas, oxygen gas, silicon tetrachloride gas, and carbon monoxide gas.

Further, in the first etching step, the third gas which is one selected from the group consisting of inert gas, nitrogen gas, oxygen gas, silicon tetrachloride gas, and carbon monoxide gas, may be added to the etching gas in an amount of the range between 0 and 10 volume % of the whole etching gas.

The first and second etching process should be carried out while maintaining the temperature of the to-be-processed substrate in the range between $-10°$ and $-120°$ C., more specifically, between $-30°$ and $-60°$ C. The pressure of the etching gas should preferably be set between 50 and 150 m Torr.

Further, the first etching process may be performed while detecting the end point of the etching by monitoring light emitted from the reactive substances, pressure change of the reaction resultants, plasma impedance or the like. More specifically, in the step of etching the first layer, the end point of etching is detected by monitoring light emitted from tungsten, molybdenum, or a molybdenum fluoride. Similarly, in the step of etching the second layer, the end point is detected by monitoring light emitted from chlorine, bromine, silicon chloride, or silicon bromide.

Even after etching the first layer, the etching may be continued to etch the underlying polycrystal silicon until complete removal of the first layer.

Moreover, according to the invention, there is further provided a dry etching method, wherein a thin film including one selected from the group consisting of tungsten, molybdenum, a tungsten silicide, and a molybdenum silicide, as the first layer, is formed on a silicon oxide insulation film, a to be-processed substrate prepared by forming a mask pattern on the thin film is placed in a vacuum container, an etching gas is introduced into the vacuum container, and an electrical discharge is induced by applying an electrical field to the vacuum container, thereby anisotropically etching the thin film in accordance with the mask pattern, characterized in that the first layer is etched while maintaining the temperature of the to-be-processed substrate in the range between $-10°$ and $-120°$ C. by use of: the first gas which is one selected from the group consisting of fluorine, sulfur hexafluoride, and nitrogen trifluoride; or a mixture gas containing the first gas and the second gas which is one selected from the group consisting of hydrogen chloride, hydrogen bromide, chlorine, bromine, and carbon tetrachloride; or a mixture gas containing the first and second gases, and the third gas which is one selected from the group consisting of an inert gas, nitrogen gas, oxygen gas, silicon tetrachloride gas and carbon monoxide gas; or a mixture gas containing the first gas and the third gas, as an etching gas.

The inventors of the present invention conducted a variety of experiments regarding etching of a multilayer film formed on an silicon oxide film, and including a tungsten silicide film as the upper layer, and a phosphor-containing polycrystal silicon film as the lower layer, and has discovered the following fact.

In reactive dry etching of a tungsten silicide by use of $SF_6$ gas, the etching speed when the temperature of the substrate is $25°$ C., is as fast as 300-400 nm/min. Thus, high-speed etching can be achieved. However, in such a case, side etching of the tungsten silicide film and the underlying polycrystal silicon is unavoidable. Such side etching can create problems, especially where the size of the elements becomes smaller and smaller.

On the other hand, in the case where the tungsten silicide is subjected to a reactive dry etching by use of $Cl_2$ gas, the etching speed when the temperature of the substrate is $25°$ C., is as slow as 50-100 nm/min.

Further, the substrate-temperature dependency of the etching speed was examined with regard to the case where a tungsten silicide is etched by use of $SF_6$ gas. The etching speed decreases in proportional to the inverse number of the substrate temperature, but at the substrate temperature of $30°$ C., the etching speed was still as fast as 230-370 nm/min. In this case, side etching did not occur to the pattern of the tungsten silicide, and therefore a vertical shape was obtained. However, side etching occurred to the underlying polycrystal silicon to a certain level.

From the results obtained, it was confirmed that when 40-70% of $Cl_2$ gas is added to $SF_6$ while maintaining the substrate temperature at $-30°$ C., side etching does not occur to tungsten silicide and polycrystal silicon, enabling a pattern formation of a vertical shape. This phenomenon can be explained as follows:

Even in such a cool condition of the substrate as mentioned, the vapor pressures of $WF_6$, $SiF_4$, and the like, generated by combining tungsten and silicon atoms of the tungsten silicide, and fluorine with each other, are high, and therefore side etching occurs. Meanwhile, the vapor pressure of $WCl_5$ or $WCl_6$, generated by combining tungsten and chlorine together, is very low, and therefore removal of the film is difficult. Consequently, the etching speed is slow when $Cl_2$ is used, and it is likely to create a deposit. Thus, by mixing an appropriate amount of $Cl_2$ into the fluorine-containing gas such as $SF_6$, the etching speed of a satisfactory level can be maintained, and a deposition layer of $WCl_x$ ($x=5, 6$) is selectively formed on the side wall of the pattern. Therefore, reaction between fluorine or tungsten, and silicon atoms is suppressed, thereby forming a vertically shaped pattern.

It should be noted that when etching a multilayer structure including tungsten silicide, polycrystal silicon, and an silicon oxide film, the etching speed for the silicon oxide can be significantly increased by adding a small amount of $SF_6$. Accordingly, if the etching selection ratio between polycrystal silicon and the silicon oxide film is small, and the etching speed within the wafer surface cannot be sufficiently uniformed, the oxide silicon film is completely etched at a section of the wafer surface.

In etching of the polycrystal silicon by use of $Cl_2$ gas, when the substrate temperature is low, the etching speed does not become so slow, and a sufficient selection ratio against the underlying silicon oxide film can be obtained. Accordingly, it was confirmed that etching which can achieve a desired vertical shape and a uniform etching speed within a wafer surface, can be carried out with the above-described condition.

In the meantime, by use of a spectrometer, each etching step was analyzed with regard to emission of light. More specifically, the peak value in connection with tungsten or tungsten silicide in the first step, and the peak value in connection with $Cl_2$ in the second step were detected to find out the end point of etching. It was confirmed that with this end point detecting technique, each etching step can be controlled at an extremely high accuracy.

By use of the technique, the temperature of the to-be-processed substrate is cooled down to $-60°$ C., and etching of the tungsten silicide film was conducted as in the first step. Here, it was possible to etch the film into a vertical shape by use of solely $SF_6$. After that, maintaining the substrate temperature at $-60°$ C., the polycrystal silicon film was etched by use of solely $Cl_2$ as in the second step. Here, it was also possible to etch the polycrystal silicon film into a vertical shape, and to obtain a sufficient selection ratio between the polycrystal silicon and the silicon oxide. Accordingly, it was confirmed that it is possible to etch a film into a vertical shape both in the periphery and central portions of a wafer.

In accordance with decrease in wafer temperature, the selectivity between the polycrystal silicon and the silicon oxide film was significantly improved. Further, there were no residuals or deposits observed.

As described, first, a tungsten silicide film is etched by solely $SF_6$ gas, or a gas mixture of $Cl_2$ and $SF_6$ until there is no etching residuals, and then, a polycrystal silicon film is etched by a gas mainly containing $Cl_2$. Thus, etching having a high selectivity against the silicon oxide can be achieved, and the overlaying tungsten silicide and the underlaying polycrystal silicon can be appropriately etched without side etching, or residuals such as deposits. Further, since the overlaying and underlaying films can be etched at the same wafer temperature, the procedure of the etching method is simplified, thereby improving the efficiency.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a characteristic diagram showing the correlation between a mixture ratio of gases, and an etching speed;

FIG. 9 is a characteristic diagram showing the correlations between a gas flow amount, and an etching speed, and between the gas flow amount and the uniformity of the etching speed;

FIG. 10 is a characteristic diagram showing the correlations between a mixture ratio of gases, and an etching speed, and between the mixture ratio and the uniformity of the etching speed;

FIG. 11 is a characteristic diagram showing the correlations between a high frequency power, and an etching speed, and between the high frequency power and the uniformity of the etching speed;

FIG. 13 is a characteristic diagram showing the correlations between a gas pressure, and an etching speed, between the gas pressure and the uniformity of the etching speed, and between the gas pressure and the selection ratio;

DETAILED DESCRIPTION OF THE PREFERRED EMBODIMENTS

The present invention will now be explained in detail with reference to embodiments shown in accompanying figures.

Figure 1:
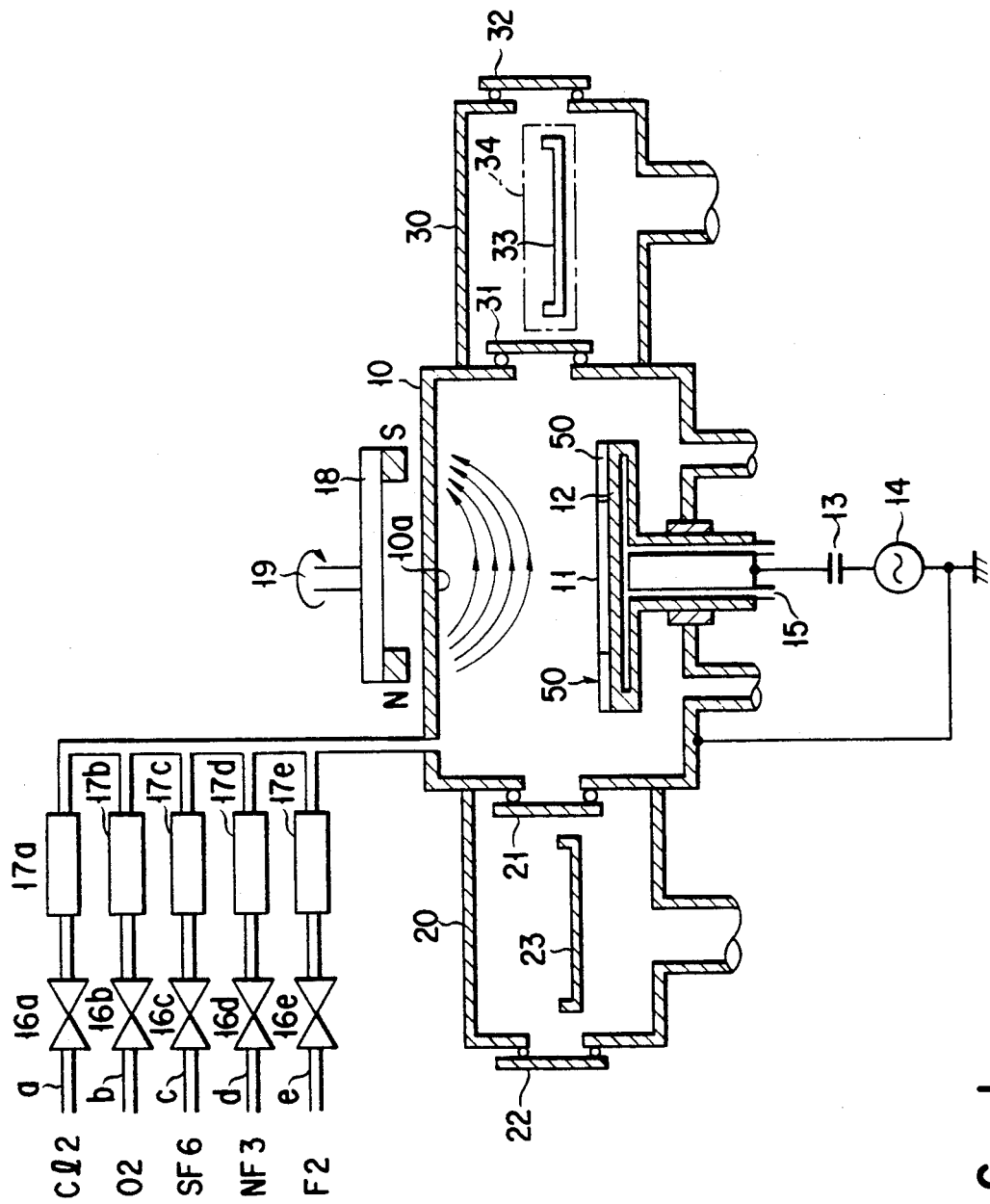
FIG. 1 is a schematic view showing a structure of a dry etching device used in an embodiment method according to the present invention.

FIG. 1 is a schematic view showing a structure of a dry etching device used in a method according to the present invention. The device includes an etching chamber 10 of a vacuum container, an inlet preparatory chamber 20, and an outlet preparatory chamber 30, connected with each other in series. A gate valve 21 is provided between the etching chamber 10 and the inlet preparatory chamber 20 so as to close the connection therebetween, and a gate valve 31 is between the inlet and outlet preparatory chambers 10 and 20 so as to close the connection therebetween.

In the inlet preparatory chamber 20, a substrate mounting base 23 is provided, and similarly, another substrate mounting base 33 is provided in the outlet preparatory chamber 30. While maintaining the vacuum state in the etching chamber 10, a to-be-processed substrate 11 can be input to the inlet preparatory chamber 20 through the gate valve 22, or output from the outlet preparatory chamber 30 through the gate valve 32. Thus, influences by moisture, oxygen, or the like in the atmosphere, can be avoided.

In the etching chamber 10, there is provided the first electrode 12 on which the to-be processed substrate 11 is mounted. A high frequency power source 14 is connected to the electrode 12 via a blocking diode 13, and the high frequency voltage of 13.56 MHz is applied to the electrode 12. An electrostatic chuck (not shown) for fixing the substrate 11 is provided on the electrode 12, and the temperature of the chuck is controlled by a cooling tube 15. The periphery of the electrode 12 is covered by a ring 50 made of carbon so that the electrode is not etched by plasma.

The upper wall of the etching chamber 12 serves as an opposite electrode 10a (second electrode) to the first electrode 12. A permanent magnet 18 is set on the upper portion of the second electrode 10a, and the magnet 18 is rotated by a motor 18. The magnetic flux density in the surface portion of the substrate 11 can be varied in the range between 60 and 120 [G] by changing the magnetic force of the permanent magnet 18. Further, the inner wall surface of the etching chamber 10 is heated by a heater (not shown) to a predetermined temperature.

To the etching chamber 10, connected are a chlorine gas supplying line a, an oxygen supplying line b, an $SF_6$ supplying line d, and an $F_2$ supplying line e. Valves 16a-16e and flow amount adjusters 17a-17e are set in the respective gas supplying lines a-e so as to control the flow amount and gas pressure of each line. With the above-described structure, a predetermined gas is introduced into the etching chamber 10, and then a high frequency voltage is applied between the first and second electrodes 12 and 10a to induce electrical discharge therebetween.

It should be pointed out that an end point detector 34 for detecting the end point of etching for each of the first and second layers may be provided as indicated by the broken lines in the figure, in the outer side of the gate valve 31. The end point detector 34 may be of the type in which change in light emitting amount corresponding to the wavelength of a resultant of reaction is detected to locate its end point, or the type in which pressure change of the resultant of reaction is detected, or the type in which change in plasma impedance is detected.

An etching method by use of the above-described device will be described.

Figure 2A:
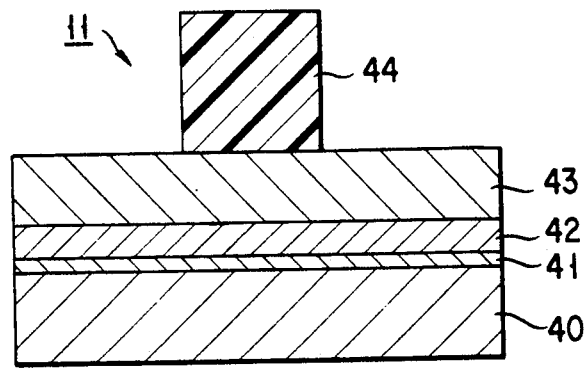
FIGS. 2A-2C are cross sections of a material at several stages of the pattern formation step in the embodiment method according to the invention.

As can be seen in FIG. 2A, 10 nm-thick silicon oxide ($SiO_2$) film 41 is formed on a silicon substrate 40 by heat oxidation, and a 150 nm polycrystal silicon film 42 is deposited thereon by the CVD method. Phosphor is then diffused into the polycrystal silicon film 42 to form an N-type polycrystal silicon film, on which a 200 nm-thick tungsten silicide ($WSi_2$) film 43 is formed by the spatter deposition method. After that, a resist pattern 44 is formed on the formed layer. The resist pattern 44 is prepared by coating a substrate surface with a photosensitive resist made of novolak resin, and the coat is selectively removed into a desired pattern by the lithography method.

Figure 2B:
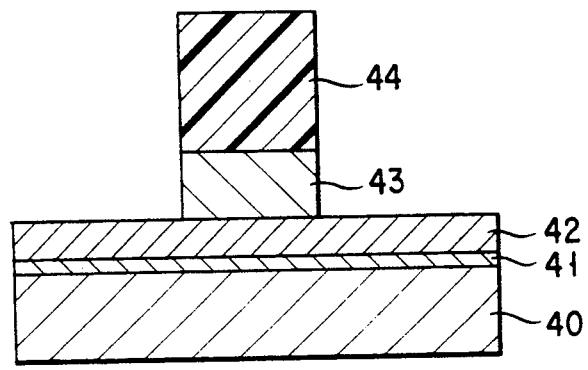
Figure 2C:
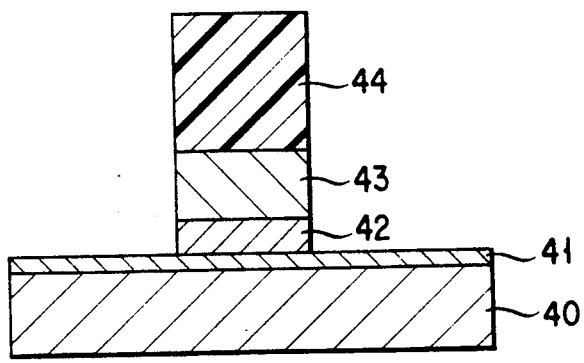

Thus formed substrate 11 to be processed is placed on the electrode 12 of the dry etching device shown in FIG. 1, and the $WSi_2$ film 43 is selectively etched by a method later explained as shown in FIG. 2. Further, the polycrystal silicon film 42 is selectively etched as shown in FIG. 2C.

The method of etching the $WSi_2$ by use of the device shown in FIG. 1 will be explained.

FIG. 3 is a graph showing the correlation between the mixture ratio of a mixture gas and an etching speed, where an $SF_6$ and $Cl_2$ mixture gas having a particular mixture ratio was introduced to the etching chamber 10 to etch the $WSi_2$ film 43, the polycrystal silicon film 42, the $SiO_2$ film 41, and the resist 44, and gas 10, and the etching speed for etching each of the layers, which varies along with a mixture ratio of the mixture gas, was examined.

Here, the partial pressures of the $Cl_2$ gas and $SF_6$ gas were changed while maintaining the pressure in the etching chamber 10 at constant (75 m Torr), and also the total flow amount at 100 sccm. The temperature of the electrode 12 was $-30°$ C., and the high frequency power was 100W (power density: $0.57W/cm^2$). The side walls of the etching chamber 10, and the upper electrode 10a were heated up to 60° C. The etching time was 1 minute. In FIG. 3, ○ denotes the etching speed for $WSi_2$, △ for resist, ● for polycrystal Si, and □ for $SiO_2$.

As is clear from FIG. 3, the smaller the mixture ratio of $Cl_2$, the faster the etching speed in the $WSi_2$, polycrystal Si, $SiO_2$, and resist layers. Especially, the etching speed in the polycrystal Si layer significantly increases as the mixture ratio of $Cl_2$ drops to 40% or lower, whereas the etching speed does not greatly change when the ratio of 40% or more.

By use of $Cl_2$ gas (100%), the etching speed with regard to $SiO_2$ is 12 nm/min, whereas by use of 80% $Cl_2$ gas, the etching speed is 36 nm/min. Thus, the etching speed is increased by a small amount of $SF_6$ added. Meanwhile, in etching of the $WSi_2$ layer, a deposit is created in $Cl_2$ gas (100%), and the etching speed is quickly decreased.

Figure 4:
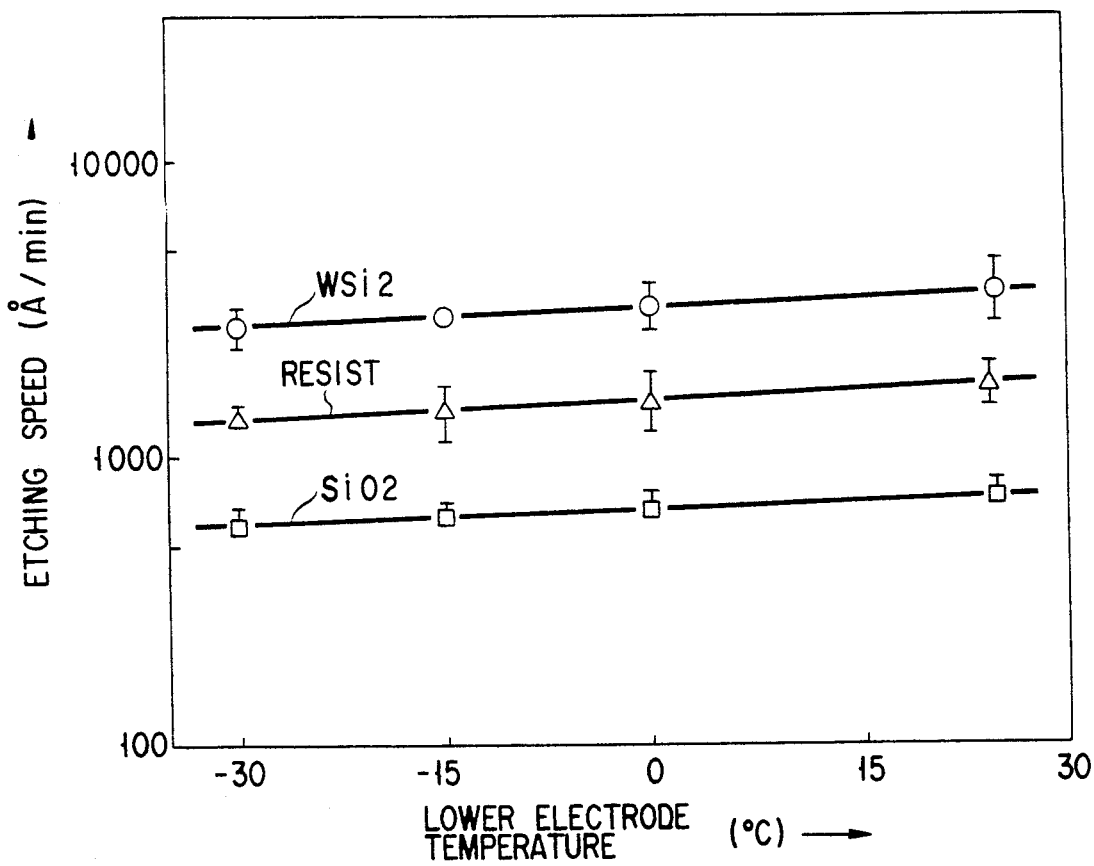
FIG. 4 is a characteristic diagram showing the correlation between the temperature of a lower electrode and an etching speed.
Figure 5A:
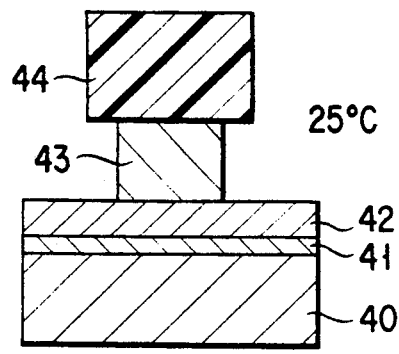
FIGS. 5A-5F are cross sections of etched shapes when etched as shown in FIG. 3.
Figure 5D:
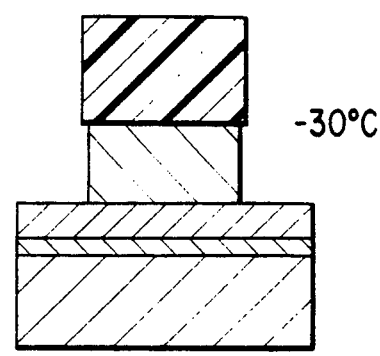
Figure 5B:
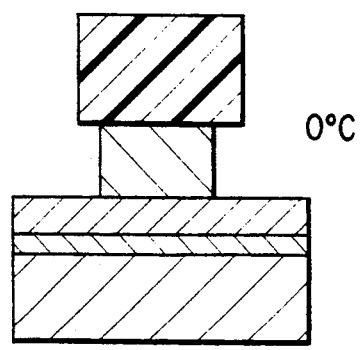
Figure 5E:
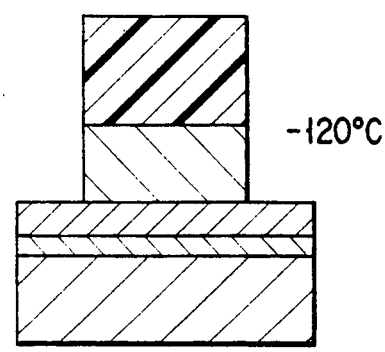
Figure 5C:
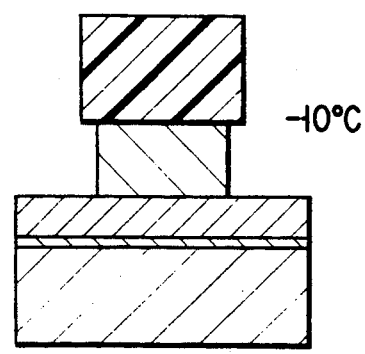
Figure 5F:
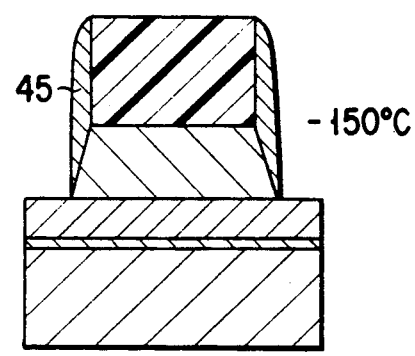

Next, the lower electrode temperature dependency of the etching speed with regard to each of the $WSi_2$ film, photoresist, and $SiO_2$ film, by use of $SF_6$ as the etching gas, at the high frequency power of 100W, the pressure of 75 m Torr, and the flow amount of 100 sccm. The results were plotted on the graph shown in FIG. 4. In FIG. 4, ○ denotes the etching speed for $WSi_2$, △ for resist, and ■ $SiO_2$.

As can be seen in FIG. 4, in accordance with decrease in temperature of the lower electrode, the etching speed with regards to each of $WSi_2$, resist, and $SiO_2$ somewhat slowed down. In the case of $WSi_2$, the etching speed was about 350 nm/min at the lower electrode temperature of 25° C., whereas about 300 nm/min at $-30°$ C. No significant drop was observed. Similarly, in the case of $SiO_2$, the etching speed was 70 nm/min at the lower electrode temperature of 25° C., whereas 60 nm/min at $-30°$ C., and thus no significant drop was observed.

FIGS. 5A-5F show pattern shapes of the $WSi_2$ film etched at several lower electrode temperatures. In these figures, alike elements are denoted by the same reference numerals as of FIG. 2A, such as silicon substrate 40, 10 nm-thick silicon oxide ($SiO_2$) film 41, 150 nm-thick polycrystal silicon film 42, 200 nm-thick tungsten silicide ($WSi_2$) film 43, and resist pattern 44. FIGS. 5A-5F show the cases where the lower electrode temperature (or substrate temperature) was 25° C., 0° C., $-10°$ C., $-30°$ C., $-120°$ C., and 150° C., respectively.

It can be understood from the figures that the lower the power electrode temperature, the smaller the amount of side etching of the pattern. In the case where the lower electrode temperature was $-30°$ C., etching of the $WSi_2$ into a vertical shape was possible by use of solely $SF_6$ gas. At a temperature of $-10°$ C., the side etching amount was 10% at the most, which is in the range of general allowance for patterning. Meanwhile, at a temperature of $-10°$ C. or lower, side-wall deposits 45 were created to deform the pattern (fattening the bottom portion). Thus, the substrate should preferably be in the range between $-10°$ C. and $-120°$ C.

Figure 6A:
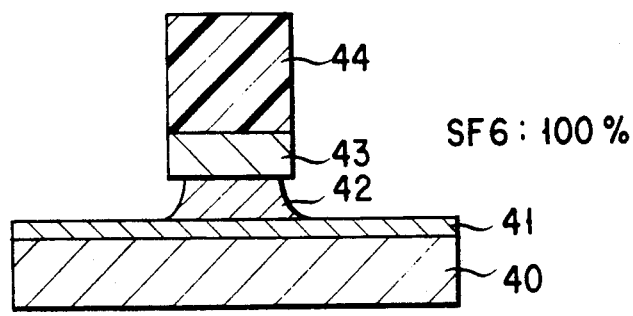
FIGS. 6A-6C are cross sections of etched shapes with a variety of gas mixture ratios.
Figure 6B:
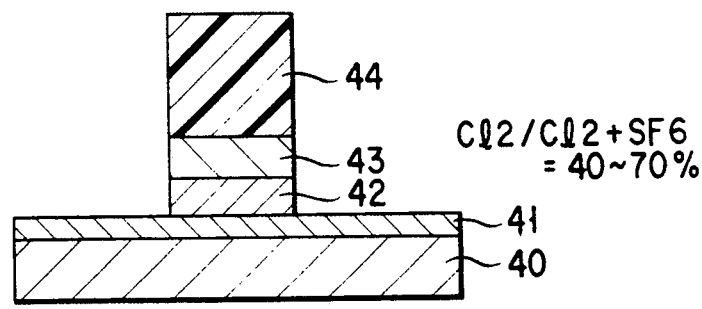
Figure 6C:
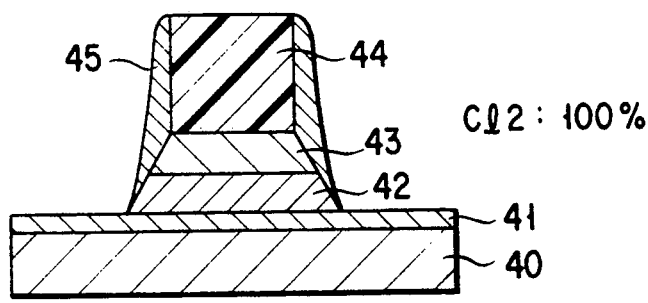

FIGS. 6A-6C show SEM observed cross sections of a material having a $WSi_2$/polycrystal Si multilayer structure etched at a variety of mixture ratio of $Cl_2$ and $SF_6$ under the same conditions as those of FIG. 3. In these figures, alike elements are denoted by the same reference numerals as of FIG. 2A, such as silicon substrate 40, 10 nm-thick silicon oxide ($SiO_2$) film 41, 150 nm-thick polycrystal silicon film 42, 200 nm-thick tungsten silicide ($WSi_2$) film 43, and resist pattern 44. FIGS. 6A-6C show the cases where the $SF_6$ gas was 100%, 40-70%, and the $Cl_2$ gas was 100%, respectively.

As can be understood from this figure, with the 100% $SF_6$, under-cut occurred to the polycrystal film 42 as shown in FIG. 6A. The amount of under-cut decreased along with addition of $Cl_2$, and when the amount of $Cl_2$ was 40%, no under-cut was observed. As shown in FIG. 6B, when the amount of $Cl_2$ added was 40-70%, a substantially vertical shape was manufactured.

With further increase in the amount of $Cl_2$ added, the pattern of the polycrystal silicon film 42 and the $WSi_2$ film 43 was deformed into a fattened bottom. When $Cl_2$ was 100%, deposits 45 were created on the side wall of the pattern as shown in FIG. 6C. The created deposits are expected to be tungsten chlorides, which were contained in the $WSi_2$ film, such as tungsten pentachloride ($WCl_5$) and tungsten hexachloride ($WCl_6$), and these chlorides were deposited due to a low vapor pressure.

A variety of experiments were conducted with regard to the etching speed in a wafer surface, and the uniformity thereof. More specifically, the etching speed for the $WSi_2$ film of a wafer surface, and the uniformity thereof were measured under the variable conditions of, namely, the high frequency power, pressure, total flow amount, and mixture ratio of $Cl_2/SF_6$. The results were as shown in FIGS. 7-10. In these figures, ○ denotes the uniformity of an etching speed, and ● denotes an etching speed. The temperature of the lower electrode was fixed to $-30°$ C. Under the above conditions, it was found that the etching speed is faster in the periphery of a wafer than the center portion thereof, in all cases.

Figure 7:
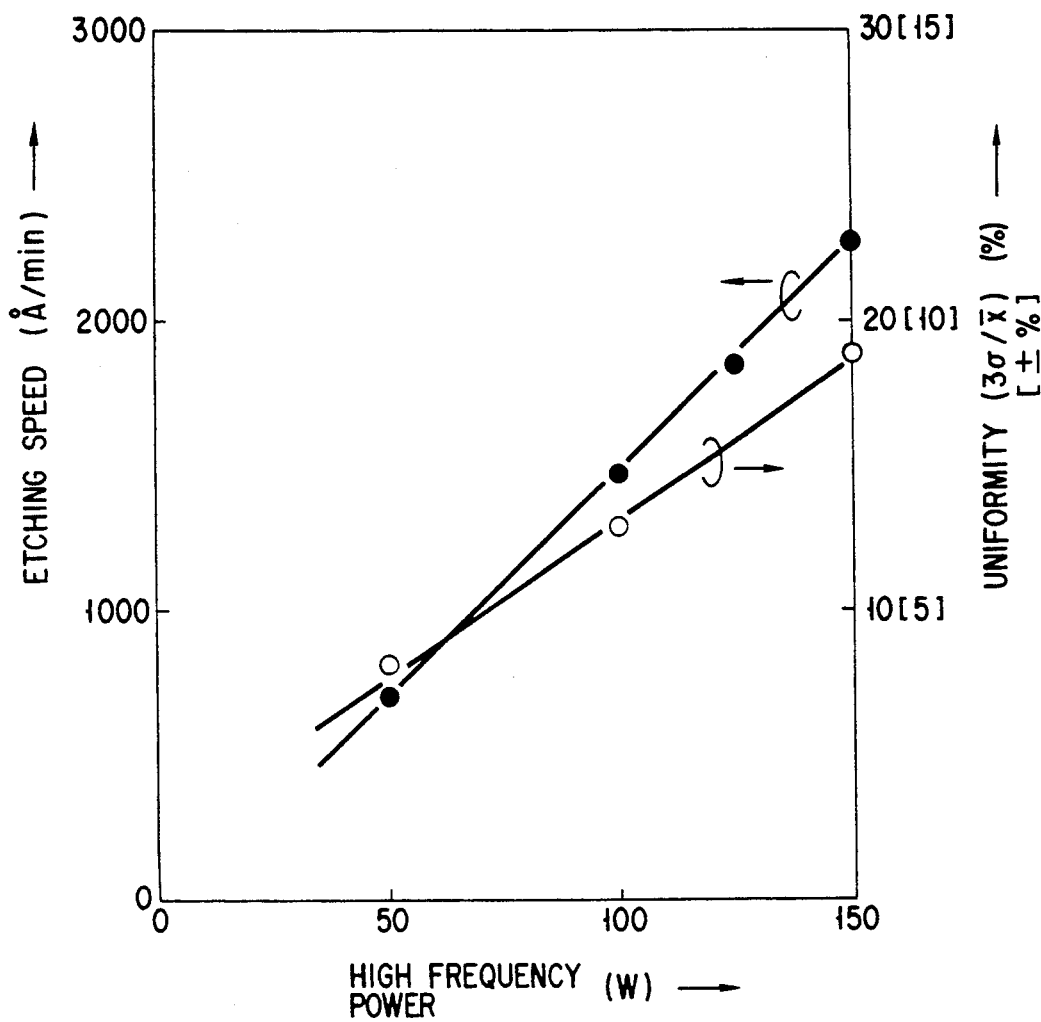
FIG. 7 is a characteristic diagram showing the correlations between a high frequency power and an etching speed, and between the high frequency power and the uniformity of the etching speed.

FIG. 7 is a graph showing the etching speed for the $WSi_2$ and the uniformity thereof, at the mixture ratio between $Cl_2$ and $SF_6$ ($Cl_2/Cl_2+SF_6$) fixed to 60%, the total flow amount to 100 sccm, and the pressure to 75 m Torr, along with a variable high frequency power. As can be understood from this figure, the etching speed becomes faster as the high frequency power increases, whereas the uniformity thereof is lowered. Further, the figure indicates that to achieve a uniformity of 20% or less, which is within the range of allowance for patterning of a gate electrode or the like, the high frequency power should be set to 160W or less, and to achieve an etching speed of 100 nm/min or higher, the high frequency power should be set to 70W or higher. It should be noted that 70–160W of power is equivalent to 0.4–0.9W/cm$^2$ of power density in consideration of the size (6 inches) of the wafer used in this experiment.

Figure 8:
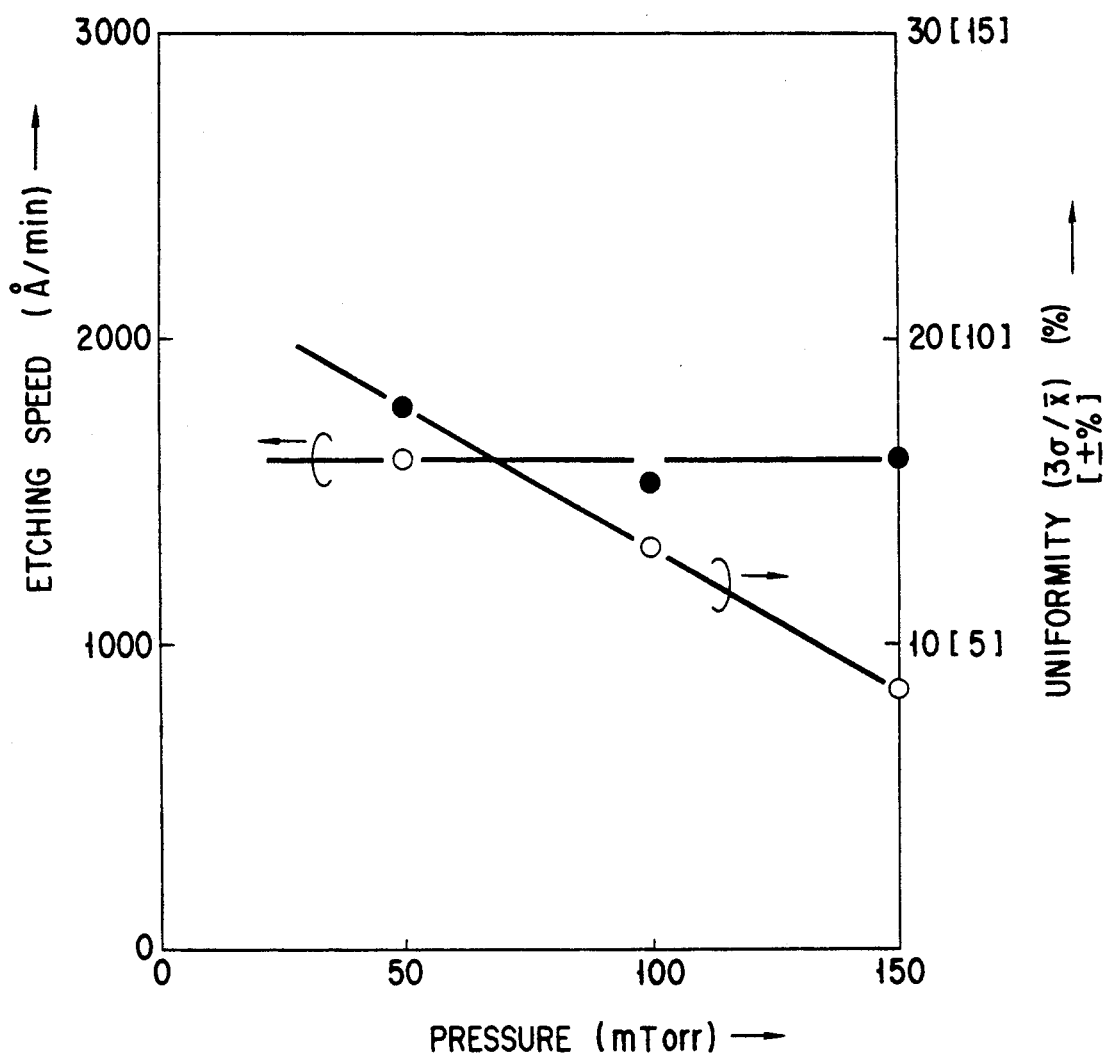
FIG. 8 is a characteristic diagram showing the correlations between a pressure, and an etching speed, and between the pressure and the uniformity of the etching speed.

FIG. 8 is a graph showing the etching speed for the WSi$_2$ and the uniformity thereof, at the mixture ratio between Cl$_2$ and SF$_6$ (Cl$_2$/Cl$_2$+SF$_6$) fixed to 60%, the total flow amount to 100 sccm, and the high frequency power to 75W, along with a variable pressure. As can be understood from this figure, the etching speed does not change even if the pressure is varied, whereas the uniformity thereof is improved when the pressure is raised. However, at a pressure of 100 m Torr or higher, under-cut occurs to the WSi$_2$ film pattern, and therefore a desired shape cannot be obtained.

FIG. 9 is a graph showing the etching speed for the WSi$_2$ and the uniformity thereof, at the mixture ratio between Cl$_2$ and SF$_6$ (Cl$_2$/Cl$_2$+SF$_6$) fixed to 60%, the high frequency power to 75W, and the pressure to 75 m Torr, along with a variable total flow amount. As can be understood from this figure, the etching speed does not change as the flow amount is varied, whereas the uniformity thereof improves as the flow amount becomes smaller. When the flow amount was decreased to less than 20 sccm, formation of deposits on the side wall of the resist pattern was observed, whereas when the flow amount exceeded 150 sccm, the uniformity went over 20%. Therefore, the flow amount of a mixture gas introduced into the etching chamber should preferably be 20–150 sccm.

FIG. 10 is a graph showing the etching speed for the WSi$_2$ and the uniformity thereof, at the high frequency power fixed to 75W, the pressure to 75 m Torr, and the total flow amount to 30 sccm, along with a variable mixture ratio between Cl$_2$ and SF$_6$. As can be understood from this figure, the etching speed becomes slower as the mixture ratio of Cl$_2$ is increased as already shown in FIG. 3, whereas the uniformity thereof improves along with increase in the Cl$_2$ ratio.

To sum up the results of the experiments, it was confirmed that to perform etching achieving a sufficient etching speed for WSi$_2$, satisfactory uniformity of the etching speed, and pattern shape, it is important to maintain the mixture ratio of Cl$_2$ (Cl$_2$/Cl$_2$+SF$_6$) within 40–70%, keep the pressure at 100 m Torr lower, and appropriately control the high frequency power and the total flow amount. However, as already indicated in FIG. 3, with a small amount of SF$_6$ added, the etching speed in each of the polycrystal Si and SiO$_2$ significantly increases. Consequently, if the uniformity of the etching speed in a wafer surface is lowered even in a small degree, since the etching speed is faster in the periphery of the wafer than in the center portion, the SiO$_2$ film 41 is etched in the periphery area, as shown in FIG. 12B.

Thus, to achieve highly accurate etching of a wafer having the above-mentioned multilayer, the important items are: the substrate should be cooled down to a necessary temperature; the WSi$_2$ film 43 should be etched by a mixture gas containing SF$_6$ and Cl$_2$; the polycrystal silicon film 42 should be etched by an etching gas mainly containing Cl$_2$ gas such as to have a sufficient etching selection ratio with respect to the polycrystal silicon film 42 and SiO$_2$ film 41 after etching the WSi$_2$ 43.

Next, to examine the etching characteristic of the polycrystal silicon film 42, the etching speed for phosphor-added polycrystal Si, and the uniformity thereof along with a variable high frequency power, were measured. The temperature of the lower substrate was fixed to $-30°$ C. The etching gas used was 100% Cl$_2$, and the flow amount thereof was 100 sccm.

FIG. 11 shows the correlations between the etching speed for phosphor-added polycrystal Si and a variable high frequency power, and between the uniformity of the etching speed and a variable high frequency power. In this figure, ○ denotes the uniformity of an etching speed, and ● denotes an etching speed. As can be see from the this figure, the etching speed increased as the high frequency power was raised, whereas the uniformity of the etching speed in the wafer surface significantly improved around 90W. Meanwhile, at the high frequency power of 50W, under-cut occurred to the polycrystal silicon, whereas at a powder of 75W or higher, a vertical shape was obtained by etching.

Next, the etching speed for polycrystal Si, and the uniformity of the etching speed along with a variable pressure were measured. FIG. 13 shows the etching speed (denoted by ● for polycrystal silicon, the uniformity (○), and the selection ratio (Si/SiO$_2$) (Δ), by use of Cl$_2$ gas, at the high frequency power 150 fixed to 150W, the substrate temperature to $-30°$ C., the flow amount to 100 sccm, except for a pressure which was variable.

As can be understood from this figure, the etching speed for polycrystal silicon increased as the pressure was raised. The selection ratio between the polycrystal silicon and SiO$_2$ (heat oxidation film) increased proportionally along with the pressure. On the other hand, the uniformity of the etching speed improved to the peak value around the pressure of 75 m Torr, and when the pressure went away from 75 m Torr to a higher or lower region, the uniformity deteriorated. Then, observation of the etched shape by the SEM indicated that side etching occurred to the pattern when the pressure was higher than 75 m Torr.

Then, in order to improve the uniformity of the etching speed for polycrystal Si, and the selectivity with respect to SiO$_2$ film, a small amount of various kinds of reactive gas was added to the Cl$_2$ gas. Thus, the etching characteristic was examined. The etching process was evaluated in terms of the etching speed, uniformity, selection ratios against SiO$_2$ and resist, and shape of the pattern, and the etching conditions were: the pressure, high frequency power, and gas flow amount were fixed to 75 m Torr, 100W, and 100 sccm, and about 0–10% of oxygen (O$_2$), silicon tetrachloride (SiCl$_4$), nitrogen (N$_2$), and carbon monoxide (CO) were added to the Cl$_2$ gas.

Table 1 shows the results of this examination. The etching characteristics vary in accordance with pressure, high frequency power, flow amount, and amount of gas add. As is clear from Table 1, a small amount of O$_2$ added to Cl$_2$ helped to improve the selection ratio while maintaining the uniformity, and anisotropic shape.

TABLE 1

| Etching gas | Condition | Etching speed (A/nin) | Seniformity (%) | Selection ratio against silicon oxide film | Selection ratio against resist layer | Shape |
|---|---|---|---|---|---|---|
| $Cl_2$ | 50 SCCX | 2532 | 11.6 | 21.5 | 3.9 | Anisotropy |
|  | 100 SCCX | 2556 | 10.9 | 23.7 | 3.8 | " |
| $Cl_2 + O_2$ | 95/5 100W | 2896 | 13.2 | 32.2 | 3.8 | Anisotropy |
|  | 98/2 100W | 2755 | 13.1 | 30.3 | 4.1 | Under-cut |
|  | 95/5,150 W | 2622 | 11.0 | 16.9 | 2.6 | Anisotrpy |
|  | 190/10,1150W | 4492 | 10.7 | 19.0 | 2.7 | " |
| $Cl_2 + SiCl_4$ | 90/10 100W | 2620 | 19.8 | 30.2 | 4.0 | Anisotropy |
|  | 70/10 100W | 2430 | 15.0 | 36.8 | 4.4 | " |
| $Cl_2 + N_2$ | 90/10 100W | 2541 | 9.1 | 22.1 | 4.2 | Taper |
|  | 50/50 100W | 1958 | 4.9 | 13.0 | 8.6 | " |
| $Cl_2 + CO$ | 90/10 100W | 2243 | 12.2 | 26.0 | 4.5 | Anisotropy |
|  | 95/5 100W | 2483 | 10.9 | 22.0 | 3.6 | " |

In this example, the etching step was divided into two, etching of $WSi_2$ film, and that of polycrystal silicon film, based on the etching characteristics, and a to-be-processed substrate having a multilayered structure of $WSi_2$/polycrystal $Si/SiO_2$, was etched by use of the device shown in FIG. 1 under the most appropriate etching conditions and with the most suitable etching gas.

First, as can be seen in FIG. 2B, the $WSi_2$ film 43 was etched. The etching conditions are: the temperature of the lower electrode was fixed to $-30°$ C.; $Cl_2$ $SF_6$ mixture gas having the mixture ratio ($Cl_2/Cl_2+SF_6$) of 40% was used as the etching gas; and the gas flow amount, pressure, and high frequency power (power density) were set to 30 sccm, 75 m Torr, and 75W (about $0.4W/cm^2$). Under these conditions, magnetron discharge was induced to perform reactive ion etching until the $WSi_2$ is completely etched.

Then, supply of the $Cl_2/SF_6$ gas was stopped, and the remaining gas was exhausted. While maintaining the temperature of the lower electrode at $-30°$ C., magnetron discharge was carried out using the $Cl_2$ gas, at the flow amount, pressure, and high frequency power density fixed to 100 sccm, 75 m Torr, and $0.5W/cm^2$, so as to etch the phosphor-added polycrystal silicon film 42. Even after the film appeared to be etched, the etching process was continued for another 20% of the etching time to make sure the film was completely etched.

Figure 12A:
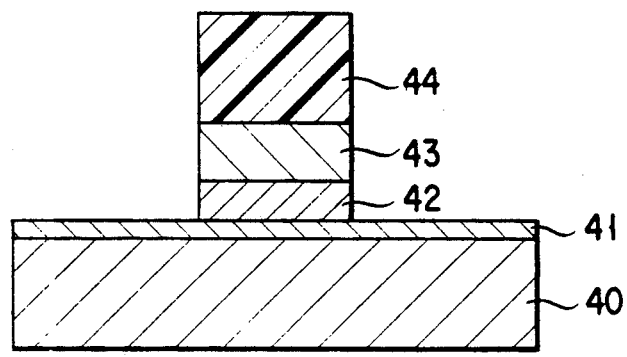
FIGS. 12A and 12B are cross sections of etched shape of a semiconductor wafer, designed for comparison.
Figure 12B:
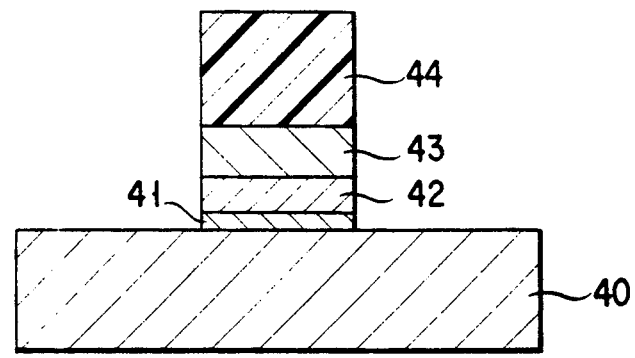

FIG. 12A shows the results of the etching. As is clear from this figure, no side etching occurred to either the periphery or the center portion of the wafer, or $WSi_2$ film 34, or the phosphor-added polycrystal silicon film 42, and a vertical shape in cross section was obtained. Further, the underlaying silicon oxide was preserved in good condition without being etched.

As described, in the method of this example, the etching step was divided into two steps, one for the $WSi_2$ film 43, and another for the polycrystal silicon film 42. In both etching steps, the lower electrode was cooled down to $-30°$ C. In etching of the $WSi_2$ film 43, a fluorine-containing gas (such as $F_2$, or $SF_6$) and $Cl_2$ gas were used, whereas in etching of the polycrystal silicon film 42, $Cl_2$ gas, or the same but containing a small amount of $O_2$ added thereto, was used. Thus, in etching of both $WSi_2$ and polycrystal Si, a sufficient etching speed, a desired shape, a sufficient uniformity of the etching speed, and a high selectivity between the polycrystal silicon film 42 and $SiO_2$ film 41 were achieved, and therefore etching of the wafer having the multilayered structure were carried out with an extremely high accuracy, and high reliability.

Consequently, when this method is applied to pattern formation of a gate electrode, a pattern can be formed with a high accuracy and without causing side etching. Further, since the silicon oxide film is never damaged, the gate insulation film can be preserved in a good condition. Therefore, a gate electrode having a high reliability and low resistance can be obtained.

Next, by use of various kinds of etching gas, etching of a tungsten silicide film, polycrystal silicon film, heat oxidation film, and a multilayer including tungsten silicide film/polycrystal silicon film/heat oxidation film, were conducted.

As the etching gas for the tungsten silicide film, a $SF_6/Cl_2$ mixture gas was used in the aforementioned example for the following reason. That is, by cooling the lower electrode to $-30°$ C., it is possible to form a vertical shape of the tungsten silicide film by use of solely $SF_6$. However, in the case where the etching process was continued for another 20% of the etching time to make sure the tungsten silicide film was completely etched by us of the mentioned gas even after the film appeared to be etched, side etching occurs to the underlaying polycrystal silicon film due to the degree of the unconformity of the etching speed.

In consideration of the above, etching of the tungsten silicide film was carried out by use of solely $SF_6$ gas, and detection of the end point of the etching was conducted for the purpose of increasing the etching speed, and preventing contamination and waste caused by tungsten silicides having a small vapor pressure. Thus, the time for over-etching was shortened.

The etching conditions were: the high frequency power of 100W, the pressure of 75 m Torr, the lower electrode temperature of $-30°$ C., and the flow amount of $SF_6$ of 100 sccm.

In the meantime, to find the end point of etching, a spectroscope was used to detect the emission spectrum (wavelength: 468 nm, 466 nm) of the molybdenum fluoride. Thus, the attenuation point of the emission spectrum intensity was monitored, to determine the end point of etching. The etched shape of the tungsten silicide film was actually observed by the SEM, and compared with the attenuation point of the spectrum intensity, and it was confirmed that the end point of etching coincides with the end point measured from the emission spectrum monitored.

Thus, etching was carried out while monitoring emission spectrum to detect the end point of the tungsten silicide film. Then, etching of the underlaying polycrystal silicon was conducted by use of $Cl_2$ as the etching gas under the conditions that: the high frequency power of 100W, the pressure of 75 m Torr, and the lower electrode temperature of $-60°$ C. Observation of the etched shape indicated no side etching occurred to the tungsten silicide film and polycrystal silicon, and therefore a vertical shape pattern was obtained.

Next, regarding nitrogen trifluoride gas ($NF_3$) and fluorine gas ($F_2$), etching of a wafer having the multilayered structure was performed under the same conditions as that for the above-mentioned $SF_6$. Here, observation of the etched shape by the SEM indicated that a vertical shape pattern was obtained in both cases of $NF_3$ gas and $F_2$ gas.

Further, similar results were obtained with a mixture gas prepared by adding an appropriate amount of $Cl_2$ to $NF_3$ or $F_2$, or a mixture gas prepared by adding an appropriate amount of HBr gas to $SF_6$, $F_2$, or $NF_3$.

In the second step of etching the polycrystal silicon, a gas mainly containing $Cl_2$ gas was used as the etching gas. Here, the emission spectrum of Cl (wavelength: 285 nm) was monitored during etching. As in the case of the tungsten silicide film, the attenuation point of the emission spectrum coincides with the end point of etching, and therefore the end point could be detected at a high reproducibility. To compare with other types of gas, etching of the polycrystal silicon was carried out by use of hydrogen chloride (HCl), hydrogen bromide (HBr), carbon tetrachloride ($CCl_4$) and bromine ($Br_2$).

The etching conditions were set based on the case of $Cl_2$ gas, namely the pressure of 75 m Torr, the high frequency power of 100W, the flow amount of 100 sccm, and the lower electrode temperature of $-30°$ C., and the conditions are varied for the purpose of each experiment. The results showed that formation of a vertical shape pattern was possible under appropriate conditions by use of these gases. Further, it was also possible to perform successful etching by use of a gas mainly containing fluorine containing gas such as $SF_6$, $NF_3$, or $F_2$, or a mixture gas containing this gas and $Cl_2$ or Hbr in the first step of etching the tungsten silicide, and a gas mainly containing a fluorine-free halogen gas such as $Cl_2$, $CCl_4$, or $Br_2$ in the second step of etching the polycrystal silicon.

Further, by introducing a noble gas such as He, Ar, Kr, or Xe to the above mentioned gas, the uniformity of the etching speed can be improved. Although this experiment was directed to etching of a tungsten silicide, the etching method of this experiment can be applied to a wafer having a multilayered structure of high melting point metal silicides such as tungsten silicide and titanium silicide, or of these metals, polycrystal silicon and silicon oxide film. The temperature of the lower electrode can be varied in the range between $-120°$ C. and $50°$ C. in accordance with a material to be etched, combination of etching gases, and etching conditions.

Figure 14:
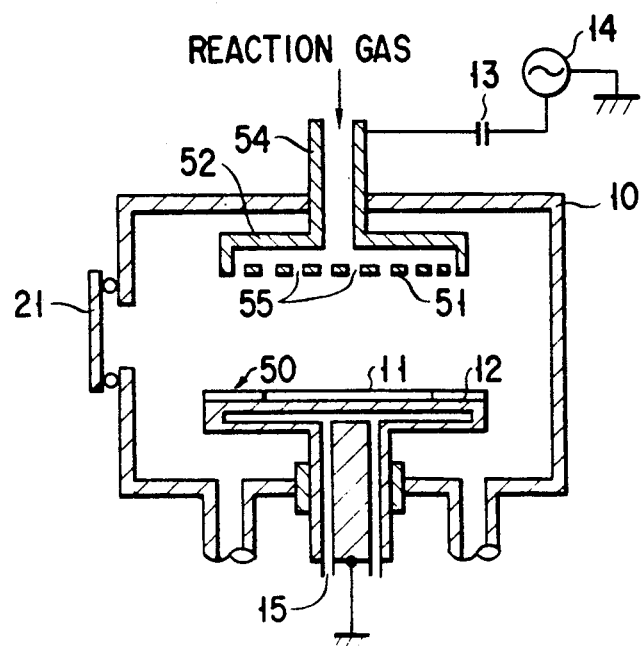
FIG. 14 is a schematic view of a structure of a dry etching device of a plasma etching mode, which is applicable to the present invention.
Figure 15:
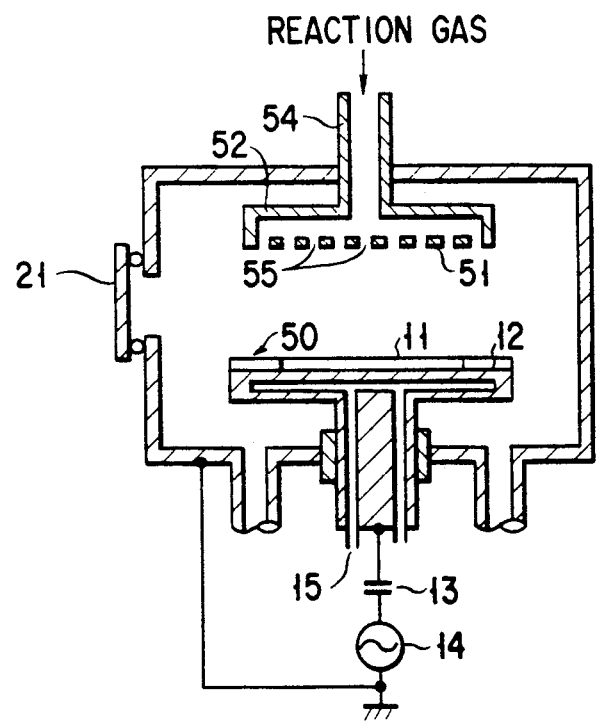
FIG. 15 is a schematic view of a structure of a dry etching device of a reactive ion etching mode, which is applicable to the present invention.

The reactive ion etching device used in this example was of the magnetron type having parallel flat plate electrodes. However, the invention is not limited to devices of this type. The type in which a microwave is applied to induce ECR discharge, or the type in which a voltage is applied to a to-be-etched substrate in discharge plasma generated by applying microwave or electron beam can be used. FIGS. 14 and 15 illustrate etching devices which are applicable to the present invention. More specifically, FIG. 14 shows a dry etching device of the plasma etching mode having the structure in which an etching chamber 10 is provided with a gate valve 21 on one side, and a lower electrode 12 on which a not-yet-processed substrate 11 on the lower side, and a high frequency power source 14 is connected to the electrode 12 via a blocking diode 13 so as to supply a high frequency power of 13.56 MHz to the electrode 12. Further, according to this structure, the cooling tube 15 is connected to the lower electrode 12 as in the device shown in FIG. 1, to cool the lower electrode 12 to a predetermined temperature. Above the upper side of the lower electrode 12, provided is an electrode body 52 including an upper electrode 51 such as to face the lower electrode 12. There is some space 53 between the upper electrode 51 and the electrode body 52, and to this space 53, connected is a gas supplying tube 54, through which a reaction gas can be supplied to the space 53 from the outside gas source. The reaction gas supplied to this space 53 can be introduced to the etching chamber 10 through a number of holes 55 formed in the upper electrode 51. A high frequency power source 14 is connected to the upper electrode 51 via a capacitor 13.

In the meantime, FIG. 15 shows a dry etching device of a reactive ion etching mode, having a similar structure to that of the dry etching device, except that a high frequency electrode 14 is connected to a lower electrode 12. Alike elements are labeled with the same numerals as those of FIG. 14, and explanations thereof are omitted.

Each of the devices shown in FIGS. 14 and 15 can be operated following the sam procedure of the device shown in FIG. 1.

Moreover, in the first step, the emission spectrum of tungsten atom was monitored to detect the end point of etching, but it may be the emission spectrum of a tungsten compound such as tungsten fluoride which is monitored. In the second step, the emission spectrum of chlorine was monitored to detect the end point of etching, but it may be the emission spectrum of a silicon compound such as silicon tetrachloride which is monitored. Other than these, the end point of etching may be detected by monitoring change in pressure of the resultant of reaction, or change in plasma impedance.

As described, according to present invention, there is provided a method of processing a film having a multilayered structure including a metal silicide (or high melting point metal) formed on an insulation thin film such as silicon oxide, and polycrystal silicon, which is divided into the first step for etching the metal silicide by use of a gas mainly containing $SF_6$, $NF_3$, or $F_2$, and the second step for etching the polycrystal silicon film by use of a fluorine-free halogen gas such as $Cl_2$, while controlling the temperature of the substrate. Therefore, a high-quality pattern formation, where no side etching occurred and the silicon oxide can be preserved in a good condition, can be achieved.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A dry etching method, wherein a multilayer film including one selected from the group consisting of tungsten, molybdenum, a tungsten silicide, and a molybdenum silicide, as a first layer, and polycrystalline silicon as a second layer underlying is formed on a silicon oxide insulating film, a processed substrate prepared by forming a mask pattern on said multilayer film is placed in a vacuum chamber, an etching gas is introduced into said vacuum container, and an electrical discharge is induced by applying an electrical field to said vacuum container, thereby anisotropically etching said multilayered film in accordance with said mask pattern, comprising:

a first etching step for etching said first layer by use of a first gas which is selected from the group consisting of fluorine, sulfur hexafluoride, and nitrogen trifluoride, or a mixture gas containing said first gas and a second gas which is selected from the group consisting of hydrogen chloride, hydrogen bromide, chlorine, bromine, and carbon tetrachloride, as an etching gas; and a second etching step for etching said second layer by use of said second gas, or a mixture gas containing said second gas and a third gas which is selected from the group consisting of an inert gas, nitrogen gas, oxygen gas, silicon tetrachloride gas and carbon monoxide gas, as an etching gas.

2. A dry etching method according to claim 1, wherein in said first etching step, a mixture gas containing chlorine and sulfur hexafluoride at a mixture ratio of 4:6 to 7:3, is used as the etching gas, and a gas flow amount, and a high frequency power density are set to 20-150 sccm, and 0.4-0.9W/cm$^2$, respectively, to etch said first layer.

3. A dry etching method according to claim 1, wherein in said second etching step, an amount of said third gas which is selected from the group consisting of an inert gas, nitrogen gas, oxygen gas, silicon tetrachloride gas and carbon monoxide gas, and mixed into said second gas is 0-10 volume % of the whole amount of the etching gas.

4. A dry etching method according to claim 1, wherein in said first etching step, said third gas which is selected from the group consisting of inert gas, nitrogen gas, oxygen gas, silicon tetrachloride gas, and carbon monoxide gas, is further added to the etching gas in an amount of 0-10 volume % of the whole amount of the etching gas.

5. A dry etching method according to claim 1, wherein said first and second etching steps are carried out while maintaining the temperature of the to-be-processed substrate in the range between $-10°$ and $-120°$ C.

6. A dry etching method according to claim 1, wherein said first and second etching steps are carried out while maintaining the temperature of the to-be-processed substrate in the range between $-30°$ and $-60°$ C.

7. A dry etching method according to claim 1, wherein said first etching step is carried out while detecting an end point of etching by monitor.

8. A dry etching method according to claim 1, wherein said second etching step is carried out while detecting an end point of etching by monitor.

9. A dry etching method according to claim 1, wherein even after etching said first layer, the etching may be continued to etch the underlying polycrystal silicon.

10. A dry etching method according to claim 1, wherein said first and second etching steps are performed by a reactive ion etching device of a magnetron type or discharge plasma type.

11. A dry etching method according to claim 1, wherein said first and second etching steps are performed by a plasma type etching device.

12. A dry etching method, wherein a thin film including a metal or a metal compound selected from the group consisting of tungsten, molybdenum, a tungsten silicide, and a molybdenum silicide, is formed as a first layer on a silicon oxide insulating film, a to-be-processed substrate prepared by forming a mask pattern on said thin film is placed in a vacuum container, an etching gas is introduced into said vacuum container, and an electrical discharge is induced by applying an electrical field to said vacuum container, thereby anisotropically etching said thin film in accordance with said mask pattern, characterized in that said first layer is etched while maintaining the temperature of said to-be-processed substrate in the range between $-10°$ and $-120°$ C., by use of:

a first gas which is selected from the group consisting of fluorine, sulfur hexafluoride, and nitrogen trifluoride;

or a mixture gas containing said first gas and a second gas which is selected from the group consisting of hydrogen chloride, hydrogen bromide, chlorine, bromine, and carbon tetrachloride;

or a mixture gas containing said first and second gases and a third gas which is selected from the group consisting of an inert gas, nitrogen gas, oxygen gas, silicon tetrachloride gas and carbon monoxide gas;

or a mixture gas containing said first gas and said third gas, as an etching gas.

* * * * *